United States Patent [19]

Pryor et al.

[11] Patent Number: 4,845,533

[45] Date of Patent: * Jul. 4, 1989

[54] THIN FILM ELECTRICAL DEVICES WITH AMORPHOUS CARBON ELECTRODES AND METHOD OF MAKING SAME

[75] Inventors: Roger W. Pryor, Bloomfield Hills; Napoleon P. Formigoni, Birmingham; Stanford R. Ovshinsky, Bloomfield Hills, all of Mich.

[73] Assignee: Energy Conversion Devices, Inc., Troy, Mich.

[ * ] Notice: The portion of the term of this patent subsequent to Feb. 28, 2006 has been disclaimed.

[21] Appl. No.: 936,552

[22] Filed: Nov. 26, 1986

Related U.S. Application Data

[63] Continuation-in-part of Ser. No. 899,446, Aug. 22, 1986.

[51] Int. Cl.$^4$ .............................................. H01L 45/00
[52] U.S. Cl. ......................................... 357/2; 357/65; 357/71
[58] Field of Search .................... 357/2; 352/65, 71

[56] References Cited

U.S. PATENT DOCUMENTS 4,366,614  1/1983  Kumurojian ......................... 357/2
4,433,342  2/1984  Patel et al. .............................. 357/2

OTHER PUBLICATIONS

Savvides, Journal of Appl. Physics, vol. 58, No. 1, pp. 518–521, Jul. 1985.

Primary Examiner—Andrew J. James
Assistant Examiner—Sara W. Crane
Attorney, Agent, or Firm—Richard M. Goldman; Marvin S. Siskind; Kenneth M. Massaroni

[57] ABSTRACT

Thin film electrical structures, such as threshold switching devices and phase change memory cells, preferably utilizing electrically stable, relatively inert, conductive electrodes including a non-single-crystal deposited film of carbon material, are disclosed. The film of carbon material, which preferably is amorphous and substantially pure, is disposed adjacent to a layer of active material such as an amorphous semiconductor, and serves to prevent undesired degradation of the active material, especially when the device is carrying appreciable current in its on-state. A method of making such structures with high quality interfaces between the semiconductor layer and the conductive carbon barrier layers adjacent thereto by successively depositing such layers in a continuously maintained partial vacuum is disclosed. The method may include a step performed in the vacuum for hermetically sealing all of, or at least the electrically switchable portion of, the active layer against subsequent contamination. Thin film structures suitable for threshold switching or memory applications and employing insulating pores having substantially sloped side walls are also disclosed.

22 Claims, 5 Drawing Sheets

THIN FILM ELECTRICAL DEVICES WITH AMORPHOUS CARBON ELECTRODES AND METHOD OF MAKING SAME

CROSS-REFERENCE TO RELATED APPLICATION

This is a continuation-in-part of U.S. patent application Ser. No. 899,446 filed Aug. 22, 1986.

FIELD OF THE INVENTION

This invention relates in general to thin film electrical devices which have electrically conductive, relatively inert, materials as coatings or electrodes therein, and in particular to solid-state semiconductor devices such as threshold switching devices and phase change memory devices, and to cells, structures, and electrodes having barrier layers used therefor.

BACKGROUND OF THE INVENTION

Certain classes of electrical devices, such as certain types of semiconductor devices, employ one or more conductive, relatively inert layers of material for electrical contacts or electrodes. These relatively inert conductive layers, which are sometimes called barrier layers, prevent impurities or other materials used elsewhere in the device from diffusing, migrating or otherwise moving into or contaminating the active regions of adjacent semiconductor material. Some conductive materials such as aluminum for example can have a deleterious effect if allowed to penetrate into certain semiconductor materials such as various kinds of amorphous semiconductor materials. Two exemplary classes of such electrical semiconductor devices where care must be typically exercised to avoid such problems will now be briefly described.

A. Threshold Switching Devices

Threshold switching devices, such as those first invented by S. R. Ovshinsky, may be generally described for the purposes used herein as a switching device which has a bistable characteristic, including a threshold voltage and a minimum holding current. Specifically, the device includes a threshold switching semiconductor material and at least a pair of electrodes in contact therewith, wherein the semiconductor material has a threshold voltage value and a high electrical resistance to provide a blocking condition for substantially blocking current therethrough, and wherein the high electrical resistance in response to a voltage above the threshold voltage value very rapidly decreases in at least one path between the electrodes to a low electrical resistance which is orders of magnitude lower than the high electrical resistance, which provides a condition or path for conducting current through the semiconductor material. The conducting condition or path is maintained in the device so long as at least a minimum holding current continues to pass through the conducting path within the device. When the current falls below this minimum current value, the device rapidly reverts to its high resistance blocking condition. The voltage drop across the semiconductor material in a threshold switch when in its conducting condition is a fraction of the voltage drop across the material when in its high electrical resistance blocking condition, as measured near the threshold voltage value of the switch.

Many different combinations of atomic elements when combined in the proper proportions and manner have been shown to produce a semiconductor material having the aforementioned threshold switching action. Examples of such materials and threshold switching devices made therewith are found in the following list of U.S. patents:

| | |
|---|---|
| 3,271,591 | 3,571,671 |
| 3,343,034 | 3,571,672 |
| 3,571,669 | 3,588,638 |
| 3,571,670 | 3,611,063 |

Threshold switches of the foregoing type are generally configured as two terminal devices. Since they exhibit symmetrical current-voltage (I-V) characteristics, they have been applied typically in alternating current applications. They are ambipolar devices, that is the currents in the conduction path or paths therein consists of both holes and electrons. They can have extremely high current densities. If driven properly, threshold switches can have extremely fast switching speeds, such as into the nanosecond region and below, and make excellent surge suppression devices. Typically, a threshold switch is constructed of a thin film of preferably amorphous semiconductor material, and may be described as a semiconducting glass, although there are a number of other forms of threshold switches such as those described in U.S. Pat. No. 3,715,634 to S. R. Ovshinsky. Two terminal threshold devices, once turned on, cannot be turned off, except by reducing the current through the device below its minimum holding current for the requisite period of time, which is typically well under one microsecond.

U.S. Pat. Nos. 3,571,670 and 3,571,672 to S. R. Ovshinsky disclose threshold switching devices which utilize carbon in the threshold switching semiconductor material used in the active region or layer of the device. The '670 patent discloses the use of carbon as up to 20 percent of a threshold switching semiconductor material, which includes boron as its major element. The '672 patent discloses the use of carbon as up to about 50 percent of a threshold switching semiconductor material, which consists essentially of silicon and carbon. These patents, like a number of the other foregoing patents, teach the use of graphite as an electrode material.

B. Memory Semiconductor Devices and Materials

A number of different types of thin film memory materials are known in the art. Typically these memory materials are initially fabricated as substantially amorphous materials in a high resistance condition or state. Some of these materials may be programmed once, while others may be programmed many times. The following U.S. patents fully describe several such memory materials, including how to make and use them in electronic memory arrays:

| | |
|---|---|
| 3,573,757 | 3,846,767 |
| 3,629,863 | 3,875,566 |
| 3,675,090 | 3,877,049 |
| 3,699,543 | 3,886,577 |
| 3,816,197 | 4,499,557 |

Typically, each of the deposited film memory devices described in these ten patents is a two-terminal bistable device including a layer of memory amorphous semiconductor material which is capable of being triggered (set) into a stable low resistance condition when a voltage applied to the spaced portions of this layer exceeds a given threshold voltage and current is allowed to flow for a sufficient duration of time (e.g., 1–100 milliseconds or more) to cause, (after termination thereof) by the slow cooling of the resulting bulk heated film, alteration of the portion of the film through which the current flows to a low resistance crystalline-like or more ordered condition. This condition remains indefinitely, even when the applied voltage and current are removed. Some of these memory materials are substantially irreversible that is, substantially non-resettable. Others may be reset to a high resistance condition. Such resetting may be accomplished by feeding a high current short duration reset current pulse (e.g., a 150 mA pulse of 10 microseconds), or several such reset current pulses at controlled intervals, therethrough. These reset pulses have been shown to substantially reverse the aforementioned phase change in the memory material. It has been shown that the set current pulse flows only through a small filament which is the only portion of the amorphous film converted to a more ordered or crystalline state of low resistance. This filamentary path may be as small as about one micron in diameter for some types of memory semiconductor material. The rest of the body of memory semiconductor material remains in its initial high resistance amorphous state.

U.S. Pat. Nos. 4,499,557 and 4,599,705 to S. Holmberg et al disclose programmable cells for use in programmable logic arrays. The cells have a highly non-conductive state settable into a high conductive state and are substantially non-resettable. U.S. Pat. No. 4,499,557 discloses the doped amorphous silicon alloys as a phase change memory material for use in such programmable cells. U.S. Pat. No. 4,599,705 discloses the use of 100 atomic percent amorphous carbon, and of alloys of carbon and silicon with a range of 100 to 0 atomic percent carbon and 0 to 100 atomic percent silicon, as a phase change memory material which may be used in the disclosed programmable cells. At least a portion of the memory material of the cell may be converted from its amorphous condition into a highly conductive more crystalline state by applying an appropriate current and voltage pulse thereacross.

C. Prior Art Electrodes And Barrier Layers

U.S. Pat. No. 3,271,591 to S. R. Ovshinsky, which discloses both threshold switching devices and memory semiconductor devices, states that electrodes to be utilized with these devices should by a conductive material which is relatively inert to the semiconductor material or materials therein. It also teaches that aluminum electrodes can cause threshold switching devices to go into a blocking state, and that gold electrodes diffuse readily into such semiconductor materials.

U.S. Pat. No. 3,343,034 to S. R. Ovshinsky teaches that electrodes utilized in threshold semiconductor devices are preferably high melting point materials, such as tantalum, graphite, niobium, tungsten and molybdenum, which are all usually relatively inert with respect to the such semiconductor materials.

U.S Pat. No. 3,611,063 to R. Neale discloses the fabrication and use of all thin film threshold switching devices and memory semiconductor devices which have thin film electrodes. In particular, it teaches that metallic film electrodes can be deposited on a substrate or on the active semiconductor material by vacuum deposition, sputtering or the like at or slightly above room temperature so that the film electrodes assume a substantially disordered and generally amorphous condition, with good electrical contact and strong adhesion between the electrodes and semiconductor material. It states that since the electrodes are substantially disordered like the active semiconductor material, there is no tendency for the semiconductor material to assume a crystalline-like state as it is being deposited on to such electrodes. The disclosed structure is said to assure good electrical contact and strong adhesion between the electrodes and semiconductor material. Although the patent teaches that substantially any good electrical conductor preferably those having a high melting point may be used, it discloses only tantalum, niobium, tungsten and molybdenum or mixtures thereof, for use as the electrode material, with molybdenum being preferred.

U.S. Pat. No. 3,675,090 to R. Neale discloses thin film semiconductor devices formed by a film of semiconductor material being deposited substantially within a pore formed in an island layer of insulating material, with an electrode-forming layer on both sides of the semiconductor material. At least one side of the semiconductor material has an effective contact area limited by the size of the pore. The patent discloses that the electrode-forming material may be a refractory conductive material such as substantially amorphous molybdenum, tantalum, niobium, tungsten, and refractory metal oxides, carbides (e.g., molybdenum carbide) and suphides (e.g., vanadium sulphide). A preferred method for constructing the aforementioned pore-type structure involves successively performing several steps in a continuously maintained partial vacuum in order to prevent contaminants from reaching critical interfaces between the active semiconductor layer and electrode-forming layers. The steps are: ion bombardment of the island of insulating material and bottom electrode material exposed with the pore, and successive evaporation or sputtering of the active semiconductor layer and top electrode-forming layer over the entire substrate surface to fill or partially fill the pores. Thereafter, the top electrode-forming layer and semiconductor layer are patterned using photolithographic techniques.

U.S. Pat. No. 3,877,049 to W. Buckley discloses an electrode made of a noble or platinum metal containing single crystal, most preferably palladium silicide grown on a silicon chip substrate as an epitaxial layer.

U.S. Pat. No. 4,499,557 to Holmberg et al discloses the use of a refractory metal alloy such titanium-tungsten, as a conductive barrier layer in memory semiconductor devices.

In R. W. Pryor, "On the Mechanism of Threshold Switching", doctoral dissertation, Pennsylvania State University (December 1972), the use of a thick block or piece of conductive vitreous carbon as both the substrate and one of two electrodes of a threshold switch with chalcogenide glass sputtered onto the solidification surface of the vitreous carbon is reported. The second electrode in this switch is a point contact of pyrolytic graphite. This switch proved quite unsatisfactory because it failed to exhibit the appropriate characteristic associated with threshold switches, namely a blocked on-state, found in rapid pulse measurements of threshold switching devices of good quality. The vitreous carbon electrode was identified as the source of the operability problem, since other threshold switches having the same chalcogenide semiconductor switching material, and two electrodes made of a point contact of pyrolytic graphite worked satisfactorily.

None of the aforementioned patents teaches or suggests the use of a deposited film of carbon as a barrier layer or as an electrode in any type of solid-state semiconductor device or other electrical device, or recognizes the benefits thereof. However, the above-cited U.S. patents are useful, and all are hereby incorporated by reference herein, since they directly relate to threshold switching devices and memory devices of the type that the present invention can be used to advantageously improve.

Accordingly, it is an object of the present invention to provide improved threshold switching devices, memory devices and other current-carrying electrical devices using a new type of conductive barrier layer made from a deposited conductive film of non-single-crystal carbon.

It is another object of the present invention to provide a highly stable, smooth, highly inert conductive surface for use as a superior electrical contact in semiconductor devices, especially those utilizing one or more semiconductor or other active materials adversely affected by the diffusion, migration or other transport of impurities or other atoms or molecules into or out of such semiconductor materials.

Yet another object is to provide a new electrode material for use in electrical devices which may be readily fabricated with a very wide range of resistivities.

A further object of the present invention is to provide threshold switching devices having excellent threshold voltage stability, especially in direct current (D.C.) and voltage limiting applications.

One more object of the present invention is to provide improved methods for fabricating electrical devices having electrodes provided with deposited films of electrically conductive, stable, highly inert, barrier layers.

SUMMARY OF THE INVENTION

In light of the foregoing objects, one aspect of the present invention provides an electrical device, comprising at least a first electrode having at least one current-carrying portion and a first deposited film of electrically conductive, non-single-crystal, phase-stable, non-switching carbon material in intimate electrical contact with at least said one portion of said electrode. The film of carbon material and the current-carrying electrode portion are arranged such that the carbon material is also a current-carrying portion of the device. The film of carbon material is preferably substantially amorphous. The term "amorphous", as used herein, includes all materials or alloys which have long range disorder, although they may have short or intermediate range order, or even contain, at times, crystalline inclusions.

The electrical resistivity of the film of carbon material used in the present invention may be readily adjusted by controlling certain deposition parameters such as sputtering power density, working pressure, substrate bias, and substrate temperature. Typically, most applications for such carbon material require a film having an electrical resistivity of less than about $10^6$ ohm-centimeters. More frequently, the resistivity of the film of carbon material will have to be less than about $10^3$ ohm-centimeters. For a number of important applications, such as low voltage threshold switching devices and memory semiconductor devices, the electrical resistivity is preferably less than about 1 ohm-centimeter.

In its broadest sense, the phrase "carbon material" as used herein refers to a material which is primarily carbon, and has the essential attributes of the substantially pure carbon material disclosed herein as a preferred embodiment. In practice, such carbon material is expected to be about 70% to 90% or more carbon by atomic weight. The carbon material may contain substantial percentages or minute percentages of other elements, mixtures or compounds in the form of one or more impurities, dopants or modifiers. For example, selected elements, mixtures or compounds that are known or later discovered may modify or improve one or more selected properties or characteristics, such as electrical or thermal conductivity, thermal-stability, structural integrity or the like, in comparison to substantially pure carbon material. As long as such carbon material can be used in the structures of the present invention as an equivalent or substitute for substantially pure carbon material, it is deemed to be within the scope of the present invention, as broadly construed.

A number of electrical devices of the present invention typically also include a body of semiconductor material having at least one current-carrying portion thereof in intimate electrical contact with the film of carbon material of the present invention. The body of semiconductor material is typically arranged such that current flowing between the semiconductor material and the current-carrying electrode portion passes through the thin film of carbon material. The semiconductor material may take any number of specific forms, such as the memory materials or threshold switching materials previously described.

A typical electrical device of the present invention, further comprises a second electrode spaced from the first electrode and having at least one current-carrying portion, and a second deposited film of electrically conductive, non-single-crystal, phase-stable, non-switching carbon material in intimate electrical contact with the current-carrying portion of the second electrode and with the current-carrying portion of the semiconductor material.

The electrical devices of the present invention, including the semiconductor material, the first and second films of carbon material, and the first and second electrodes are preferably all formed of thin film materials. For some applications the carbon films may range in thickness from 2,000 angstroms to about 1 micron or more. However, for most low voltage applications, the carbon films will be less than 2,000 angstroms thick, typically about 1000 angstroms thick, and may be made as thin as 200 angstroms or less, if desired.

The embodiments of the present invention disclosed herein include three types of thin film electrical devices: those having substantially vertical current conduction paths, those having substantially horizontal current conduction paths, and those having substantially diagonal current conduction paths.

The devices and structures of the present invention are extremely stable and particularly well-suited for various threshold switching device applications, including: (1) surge suppression; (2) protection against high voltage transients such as lighting, electrostatic discharge (ESD), electromagnetic pulse (EMP) and electromagnetic induction (EMI): (3) cell or pixel isolation devices in electronic arrays such as thin film memory arrays and thin film electroluminescent displays as disclosed in U.S Pat. Nos. 3,708,717 and 3,573,757; and (4) thin film line driver circuits for electronic-arrays as disclosed in copending U.S. patent application Ser. No. 899,442 filed Aug. 22, 1986 by W. Czubatyj et al, and entitled "Electronic Arrays Having Thin Film Line Drivers", which is hereby incorporated by reference herein.

According to another aspect of the present invention, there is provided a method of making an electrical device having a layer of semiconductor material and a first conductive film of non-single-crystal carbon material in intimate electrical contact therewith. This method minimally comprises the steps of: (a) establishing and continuously maintaining a partial vacuum while all subsequent steps are performed; (b) in said vacuum depositing said semiconductor material layer; and (c) in said vacuum depositing said first film of carbon material. The method may also comprise the further step (d) of in said vacuum depositing a film of highly conductive electrode material that is in intimate electrical contact with the first film of carbon material on a side thereof opposite that of the layer of semiconductor material. In another version of this method, step (d) is performed before step (c) which is performed before step (b). The method may also further comprise the step of, in said vacuum, depositing a second conductive film of non-single-crystal carbon material in intimate electrical contact with the layer of semiconductor material. The method may further include the step of, in said vacuum, depositing a second film of highly conductive electrode material that is in intimate electrical contact with said second film of carbon material on a side thereof opposite said layer of semiconductor material.

In another aspect of the present invention, there is provided a method of making an electrical device having a deposited active layer of threshold switching material or phase change memory material at least a portion of which is capable of being altered between two electronically distinguishable states and is physically sandwiched between two electrode layers. This method comprise the steps of: (a) establishing and continuously maintaining a partial vacuum while all subsequent steps are performed; (b) in said vacuum depositing a first layer of electrode material that is relatively inert with respect to said active material; (c) in said vacuum depositing said layer of active material directly over at least a portion of said first layer; and (d) in said vacuum depositing a second layer of electrode material that is relatively inert with respect to said active material directly over at least a portion of said active layer directly over at least a portion of said active layer, whereby extremely clean interfaces between said active layer and said first and second layers of electrode material are formed. This method may further comprise the step of (d) providing an insulating material on top of an electrically conducting bottom layer, said insulating material having an opening therein exposing at least a section of said bottom layer and wherein said first layer, active layer and second layer are successively deposited over said opening, thereby forming a vertical path for conducting current between bottom layer and second layer through said opening, first layer and active layer. The method may also include the step of in said vacuum depositing a passivating layer over said second layer to hermetically seal said active layer against possible sources of contamination.

In another aspect of the present invention, there is provided an improvement in a solid-state electronic device having bottom electrode layer capable of conducting current, a layer of insulating material formed (e.g., deposited) over at least a portion of said bottom layer and provided with at least one opening formed therein to expose a section of the surface of the bottom layer, a deposited layer of active material, at least a portion of which is capable of being altered or switched between two electronically distinguishable states, said active material overlying said opening and filling at least that portion of said opening adjacent to said bottom layer, and a top electrode layer (e.g., deposited) over at least a portion of said layer of active material. The improvement in this device comprises in combination the addition of a thin film of electrically conductive, phase-stable, non-switching, non-single-crystal material deposited after the formation of said opening and before the deposition of the layer of active material. At least a portion of this thin film is disposed within said opening between and in intimate electrical contact with said bottom layer and said layer of active material.

In another embodiment, there is disclosed an alternative improvement in the same type of solid-state electronic device just described above. In the alternative improvement substantially all of the surface of said insulating layer defining the opening in the device generally slopes diagonally away from said section in an upward direction at an average angle of less than 70° from the bottom layer, thereby substantially eliminating step coverage problems associated with depositing said active layer into said opening. Preferably, the average angle is in the range of about 35°0 to about 55°. In this alternative embodiment, the opening in the device is usually quite small, i.e., has at least one dimension, as measured along the bottom layer, of less than ten microns.

Other aspects, objects, features and advantages of the present invention will become apparent from the subsequent description and the appended claims taken in conjunction with the accompanying drawings.

DETAILED DESCRIPTION OF THE PREFERRED EMBODIMENTS

In the Figures, there are shown several electrical devices of the present invention all of which are current-carrying solid-state semiconductor devices having a plurality of electrodes, a plurality of thin films of carbon material associated with the electrodes, and a body or layer of semiconductor material in intimate electrical contact with the thin films of carbon material. Each of the electrodes are in intimate electrical contact with its respective thin film of carbon material such that current flows into one electrode through its layer of carbon material through the semiconductor material into the second layer of carbon material and from there into the second electrode. The embodiments of the present invention in general will now be described with respect to threshold switching devices for which they are particularly well suited.

Figure 1:
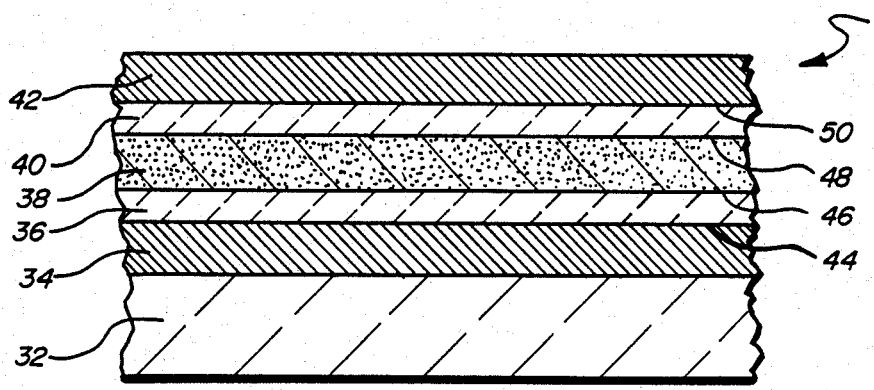
FIG. 1 is a partial side view in cross-section of an electrical device of the present invention.

Referring now to FIG. 1, there is shown an electrical device 30 of the present invention which is preferably a threshold switching device, and which utilizes a pair of conductive films of carbon material as barrier layers disposed between a center layer of semiconductor or active material and upper and lower metallic electrodes. Each film of carbon material may be considered as part of the electrode to which it is adjacent. The device 30 is formed on a substrate 32 which may be conductive or insulating, as required for the device application. Stainless steel, copper, and aluminum are examples of suitable conductive substrates, while glass, crystal silicon and crystal sapphire wafers are examples of insulating substrates. Successively deposited above the substrate 32 are a region or layer 34 of electrode material, a film 36 of carbon material, a body or layer 38 of semiconductor or active material, an upper region or film 40 of carbon material, and a top metal electrode 42.

The electrodes 34 and 42 are preferably formed of molybdenum, although they can be any other suitable highly conductive material, preferably those with high melting points and which are relatively inert with respect to the semiconductor material of layer 38, such as tantalum, niobium, tungsten, molybdenum, and tantalum-tungsten alloy. The films 36 and 40 are electrically conductive, non-single-crystal, phase-stable, non-switching carbon material. The thin film 36 is in intimate electrical contact with the electrode 34 at interface 44 and with the semiconductor layer 38 at interface 46. The film 40 of carbon material is in intimate electrical contact with the semiconductor layer 38 at interface 48 therebetween, and with upper electrode 42 at interface 50 between film 40 and electrode 42.

The electrode layers 34 and 42 may be deposited using any conventional or suitable technique such as sputtering, evaporation, vapor deposition, or the like. Preferably, the electrode layers are deposited as amorphous films by maintaining the temperature of the surface upon which they are being deposited sufficiently cool, so that the atoms condense into a generally disordered or amorphous state upon contacting the deposition surface.

The films of carbon material 36 and 40 are preferably deposited using DC magnetron sputtering. Typical process parameters are a substrate temperature of about 100 degrees C., a pressure of 0.5 pascal, a deposition rate of 200–300 angstroms per minute, and a distance of approximately 6 centimeters between source and target. The resultant film of carbon material which results under these conditions is uniformly amorphous (a-carbon). Preferably, a pure carbon source is used so that the resultant film is substantially pure carbon. As used herein, pure carbon source means a source of material that is at least 99.9 percent carbon and preferably is 99.99 percent more pure carbon. When amorphous carbon is sputtered under such conditions, it may have a resistivity as low as about 0.25 ohm-centimeters.

More detailed information about the process for sputtering such conductive thin films of substantially amorphous carbon, and the electrical and structural characteristics of such films is provided in N. Savvides, "Fourfold to Three-fold Transition in Diamond-Like Amorphous Carbon Films: A Study of Optical and Electrical Properties", Journal of Applied Physics, Vol. 58, No. 1, pp. 518–521 (July, 1985), which is hereby incorporated by reference.

The threshold switching material or other active material of layer 38 may be deposited using any suitable or conventional technique well-known to those in the art. The preferred threshold switching materials used for layer 38 in the FIG. 1 device (and in the active layer of the devices shown in the other Figures) are films of amorphous semiconductor material which include one or more chalcogenide elements, i.e., sulphur, selenium and tellurium. (However, any type of semiconductor material which exhibits suitable switching behavior useful for overvoltage protection, voltage clamping or other electronic applications may also be used in the devices of the present invention.)

A preferred composition for layers 34–42 of device 30 when device 30 is used as a thin film threshold switching device is disclosed in Table I below. Table I lists exemplary materials and exemplary ranges of thicknesses for threshold switching devices of FIG. 1 and the other figures. A typical thickness for sample devices constructed and tested are also given. The thickness values are in angstroms.

TABLE I

| Reference Numeral | Exemplary Material | Range of Thicknesses | Typical Thickness |
|---|---|---|---|
| 42 | molybdenum | 1,500–25,000 | 5,000 |
| 40 | a-carbon | 100–2,000 | 1,000 |
| 38 | $Te_{39}As_{36}Si_{17}Ge_7P_1$ | 100–50,000 | 5,500 |
| 36 | a-carbon | 100–2,000 | 1,000 |
| 34 | molybdenum | 1,500–25,000 | 5,000 |

In fabricating device 30, it is highly preferred to deposit the layers 34 through 42 in sequence while substrate 32 is continuously maintained under a partial vacuum. This helps ensure that extremely clean interfaces are formed between the layers, and greatly reduces the chance for any appreciable amount of contaminants such as air, water vapor, dust or the like to contaminate the interfaces. This not only helps ensure fine physical integrity of the interfaces 44–50, but also helps ensure the formation of high quality electrical interfaces between the layers. Such clean interfaces are believed to help greatly reduce possible localized heating effects and nucleation sites for undesired localized crystallization of the semiconductor materials, which may well adversely affect the electronic repeatability and long-term stability of the device.

As indicated in Table I, the layers 34–42 and device 30 are preferably thin film. As used herein, the term "thin film" typically refers to a film having a thickness of less than five microns. Those in the art will appreciate, however, that for certain applications it is possible to scaleup the indicated thicknesses of the embodiment of the present invention so that at least some of the layers, such as the semiconductor layer 38 or electrode layers 34 and 42, may be thicker than five microns.

The thickness of the semiconductor film (layer 38) is related to the specified threshold voltage $V_{TH}$ which is desired, and may be adjusted in a manner well understood in the art. On the average, the threshold voltage of threshold-type semiconductor materials such as that listed in Table I is approximately 15 volts per micron of conduction path length. Therefore, in order to achieve a threshold voltage on the order of 8 to 9 volts in a vertical threshold device of the type shown in FIG. 1, for example, layer 38 is made approximately 5200 angstroms to 6000 angstroms thick.

The thickness of the various thin films used in the FIG. 1 structure, as well as the other structures of the present invention, may be readily controlled using any one of several techniques well known in the art. Those in the art will readily appreciate the threshold voltage of the device 30 may be made much higher or much lower simply by increasing or decreasing the thickness of the semiconductor layer 38.

In operation of the electrical device 30, current from its first electrode passes through at least one portion of the first carbon layer, through at least a filamentary path or portion of the semiconductor material and through the second carbon film to the second electrode. Since current takes the path of least resistance, which should always be through the shortest or more direct route through material of uniform resistivity, the current conduction path in the thin carbon films 36 and 40 and the semiconductor layer 38 of FIG. 1 should be substantially vertical.

In recent experiments with structures of the type shown in FIG. 1 and other Figures herein, it has been confirmed that the pore saturation current density of the threshold switches of the present invention is about $2 \times 10^4$ amps per square centimeter. It also has been confirmed that this current density remains substantially constant, even as the amount of current changes. Accordingly, it is believed that the cross-sectional area of a filamentary current path through threshold switching semiconductor material expands in correspondence to any increase in current and contracts in correspondence to any decrease in current. The conduction mechanism in threshold switching materials is well understood to be electronic rather than thermal in nature. The electronic nature of the initiation of threshold switching, of the on-state and the recovery process in threshold switching devices is discussed at length at D. Adler, et al., "Threshold Switching In Chalcogenide-Glass Thin Films", *Journal of Applied Physics*, Vol. 51, No. 6, pp. 3289–3309 (June, 1980), the disclosure of which is hereby incorporated by reference.

One important advantage of the structures of the present invention, including the FIG. 1 structure, is that they have excellent long-term D.C. (direct current) stablity. In a conventional threshold switching device, the threshold voltage value changes after one or several exposures to D.C. pulses which switch the device to its on-state and cause relatively large currents to pass therethrough. This change is believed due to thermal or electrothermal migration of electrode materials or processing residue into the active or semiconductor layer, and the resultant alteration of the morphology and/or chemistry of that layer. For example, it is known that as threshold switching material (or phase-change memory material) heats up, its threshold voltage value is lowered, but when it cools off, the threshold voltage value returns nearly to its original value. However, the threshold voltage value gradually degrades as the number of D.C. pulse-induced heating events increases. In contrast, in the prototype devices of the present invention we have constructed, the threshold voltage value always returns to its original value, even after multiple heating events caused by D.C. pulses. In a conventional device, the problem of degradation of the threshold voltage value is even more severe when for a lengthy period of time D.C. current is passed continuously therethrough while the device is in its on-state. In contrast, our prototype devices show no appreciable change in threshold voltage value, even after continuously passing large D.C. currents for several days. Thus, the devices of the present invention are well suited for applications involving repeated or long-term exposures to D.C. currents or voltages, and are quite resistant to degradation due to heating effects.

Figure 2:
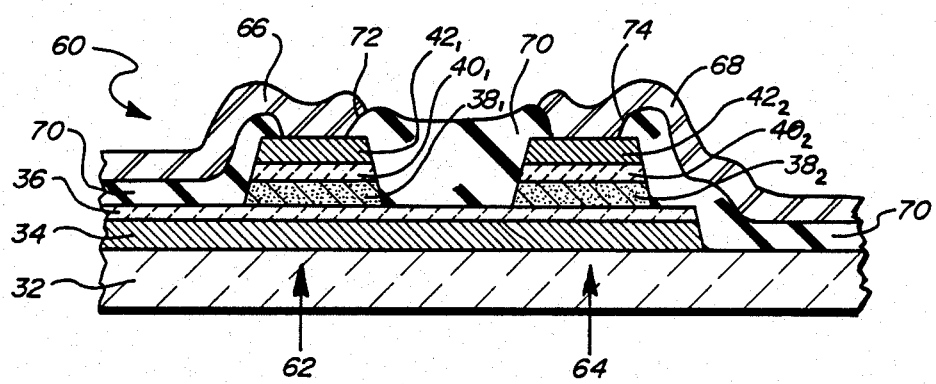
FIG. 2 is a partial side view in cross-section of two electrical devices of the present invention, each having a mesa structure disposed on a common bottom electrode.
Figure 3:
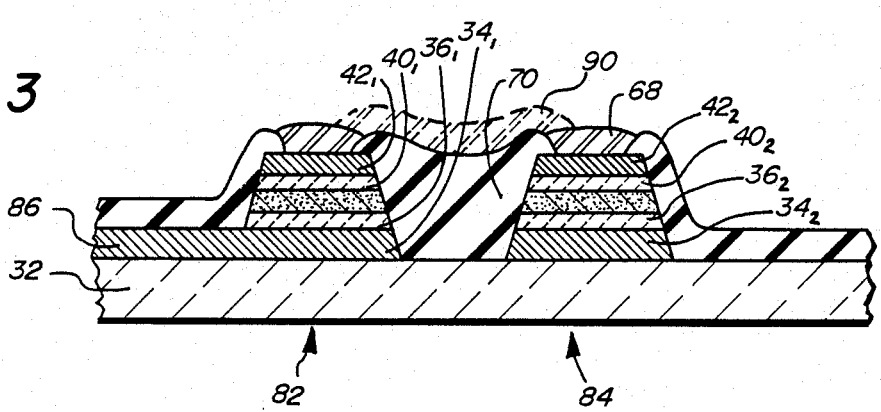
FIG. 3 is a partial side view of two alternative mesa structure devices of the present invention which are electrically isolated from one another.

While the basic device structure shown in FIG. 1 clearly has utility for many applications, it has been found desirable in certain applications to pattern some or all of the layers in the multiple layer structure shown in FIG. 1 into mesa structures, as is shown by way of example in FIGS. 2 and 3.

The FIG. 2 shows a thin film structure 60 including two mesa structures 62 and 64 arranged on a common substrate 32. The mesa structures 62 and 64 have conductors 66 and 68 respectively connected to their upper electrodes. The mesa structures 62 and 64 represent two distinct threshold switching devices having a common electrode. The overall structure 60 may be constructed by suitably patterning a multilayer structure 30 of FIG. 1 using conventional or suitable lithographic and etching techniques. The structure 60 includes a common electrode 34 and a common film of carbon material 36. In particular, the mesa structures 62 and 64 are formed by patterning layers 38, 40 and 42 into distinct sets of layers $38_1$, $40_1$, $42_1$ and $38_2$, $40_2$, $42_2$, as shown in FIG. 2. Once layers 38 through 42 have patterned, an insulating layer 70 is deposited over the entire structure. Layer 70 may be any suitable deposited thin film insulating material such as silicon oxide ($Si_xO_y$), silicon nitride ($Si_xN_y$) or preferably siliconoxynitride ($SiO_xN_y$). Layer 70 may range in thickness from about 0.3 to 2.5 microns depending in part on the combined thickness of layers 38–42, and is preferably about 0.6 micron thick for the typical thicknesses of layers 38–42 shown in Table I. After layer 70 has been deposited conventional photolithographic and etching techniques are used to create openings or vias 72 and 74 therein above mesa structures 62 and 64. Thereafter, a top metallization layer is deposited over the entire structure 60 and may be patterned so as to provide individual conductive lines 66 and 68 to mesa structures 62 and 64, thereby allowing them to be accessed as separate electrical devices. Layer 34, as well as traces 66 and 68 may be connected to other thin film devices connected on the same substrate or to terminal pads (not shown) to provide easy connection to the threshold switching devices 62 and 64. The etching of the various thin film layers of structure 60 may be accomplished using conventional or suitable etchants, either wet or dry, known to those in the art.

FIG. 3 shows a thin film structure 80 containing two mesa structures 82 and 84 which include more patterned layers than do the mesa structures of FIG. 2. Specifically, layer 34 is shown partially etched away to form conductive pads 34₁ and 34₂ for mesa structures 82 and 84 respectively. These pads serve as the lower electrodes. Similarly, thin film carbon layer 36 has been etched into portions 36₁ and 36₂ as shown. The remainder of the processing steps may be carried on as previously described with respect to FIG. 2 in order to create distinct portions of layers 38, 40 and 42. The lower electrode 34₁ of structure 82 is shown extending to the left so that contact may be made thereto at a portion 86 thereof. The lower electrode portion 34₂ may be similarly extended in any direction, space permitting, to provide an electrical contact thereto. Thus, in mesa structures 82 and 84 both electrode layers, both carbon film layers and the semiconductor layer have been patterned, so as to form a completely isolated threshold switching device. If desired the top metallization layer, which is shown patterned into traces 66 and 68, can be interconnected by a connecting portion of 90 which can be patterned at the same time as conductor 66 and 68. In this manner, devices 66 and 68 can be connected in parallel if desired for increased current-carrying capability or for any other circuitry purpose.

Figure 4A:
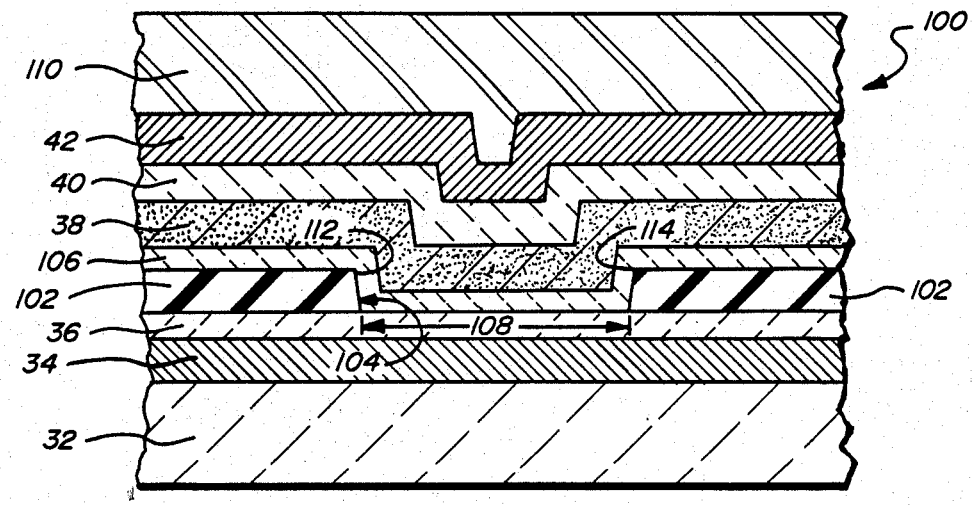
FIGS. 4A, 4B and 4C are partial side views of electrical devices of the present invention having a vertical conduction path formed through an opening in an insulating layer.

Thin film structure 100 of FIG. 4A is another vertical embodiment of the present invention. In addition to the layers 34 through 42 previously mentioned, structure 100 features two additional layers, namely an insulating layer 102 which has an opening or pore 104 therein and an additional, very thin layer of carbon film 106 deposited on top of insulating layer 102. The layers 102 and 106 are sandwiched between the thin film carbon layer 36 and semiconductor layer 38, as shown. The horizontal length 108 of the opening 104 may be any desired size such as ten microns, five microns, or less. The thickness of insulating layer 102 may range from 1,000 to 10,000 angstroms or more and preferably between 2,400 to 6,000 angstroms. A highly conductive top metallization layer 110, preferably made of aluminum and on the order of 0.5 microns to about 2.0 microns thick, and in intimate electrical contact with upper electrode 42 may be provided if desired to increase ampacity of electrode 42 and improve heat dissipation. Like in the FIG. 4B device, the structure 100 of FIG. 4A may be patterned into a mesa structure if desired simply by etching through the various layers a short distance (such as 2 to 10 microns) outside of the top left edge 112 and top right edge 114 of the opening 104.

Figure 4B:
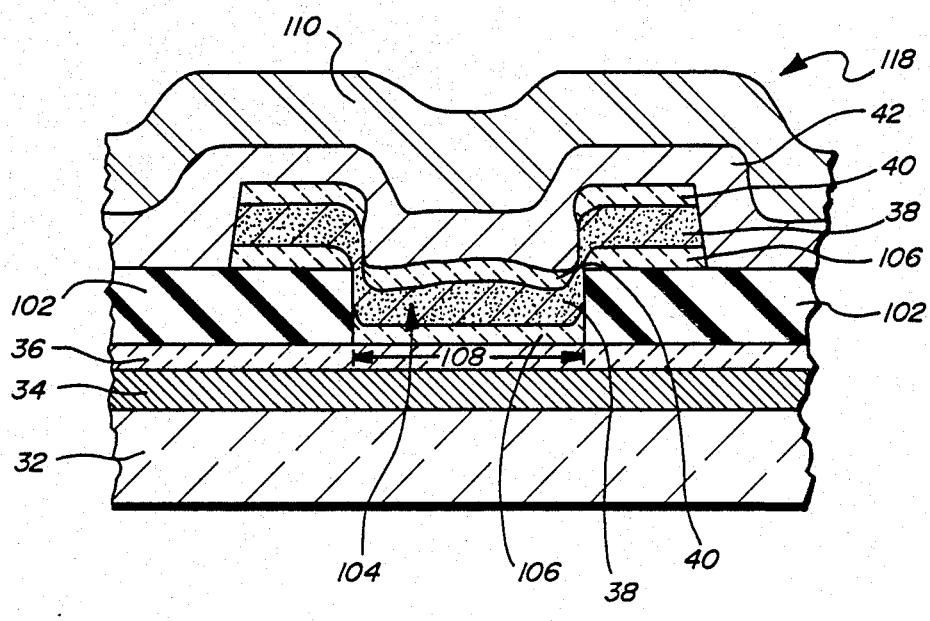

The mesa structure 118 shown in FIG. 4B is formed using the same basic structure 100 shown in FIG. 4A, except that layers 106, 38 and 40 may be patterned as shown prior to the deposition of layer 42. When layer 42 is deposited, it overlies and extends beyond the mesa structure formed by patterned layers 106, 38 and 40, thus providing a cap or passivation layer which acts to hermetically seal the layers 106, 38 and 40 from possible exposure to adverse environmental conditions. Thereafter, the top metallization layer 110, which is preferably aluminum, may be deposited, and if desired, patterned into a suitable shape for a conductor.

To fabricate the structures 100 and 118, the layers 34, 36 and 102 are deposited in sequence, preferably while under a continuous partial vacuum. Thereafter, a layer of photoresist is deposited on top of insulating layer 102, and exposed and developed so as to create a suitable mask for forming the opening 104 in layer 102. Thereafter, layer 102 is etched with a suitable solvent or dry etchant to form opening 104. The photoresist mask is thereafter removed. In order to ensure a high integrity interface between the semiconductor material and the bottom electrode 34, a partial vacuum is established, and thereafter layers 106, 38, 40 and 42 are subsequently deposited while substrate 32 remains continuously in the partial vacuum. Layers 106, 38 and 40 may be and preferably are deposited through a metal mask having a suitably sized opening which is brought into position so that its opening is centrally located above opening 104. If desired, layer 42 may also be deposited through another metal mask having a slightly larger opening centrally located above opening 104. Depositing layers 106, 38 and 40 through a mask makes it unnecessary to expose the active layer 38 to any etchants or photoresist materials which could possibly contaminate the layer 38 such as by producing undesired surface states.

Layer 106 may range in thickness from 30 angstroms to 300 angstroms and is preferably 60 to 200 angstroms in thickness, with 60 to 100 angstroms being most preferred. Depositing layer 106 before depositing the semiconductor or active layer 38 produces at least two advantages. Firstly, when layer 106 is made of the same material as layer 36, which is strongly preferred, there is little if any electronic effects or interactions at the interface between the layers, and a very good mechanical bond and minimally resistive electrical connection is created between the two layers. Secondly, active layer 38 can thereafter be deposited on the top surface of layer 106, while it is still in a virgin or pristine condition (since it was just deposited) by maintaining a continuous partial vacuum while layers 106, 38 and 40 are being deposited. This procedure thus ensures that the interfaces between active layer 38 and barrier layers 106 and 40 are substantially free of contaminants and defects induced by exposure to air.

In the FIG. 4B device, the insulating layer 102 is shown to be considerably thicker than corresponding layer 102 in FIG. 4A. For example, if the combined thickness of layers 106, 38 and 40 is 6,600 angstroms, insulating layer 102 in FIG. 4A can be made 6,500 angstroms thick and preferably somewhat thicker, such as 8,000 to 12,000 angstroms thick. Also, the side walls or surface of insulating layer 102' defining the opening 104 in FIG. 4B are shown to be more nearly vertical than the side walls defining opening 104 in FIG. 4A. Such steeply sloped or substantially vertical side walls can be produced by anisotropic dry etching processes, such as reactive ion etching, as is well known in the art. On account of the thicker insulating layer and steeper side walls, the central portions of layers 106, 38 and 40 are disposed in the opening 104 substantially below the outer portions of layer 106, 38 and 40, which are disposed above the insulating layer 102, thus helping to ensure that the effective cross-sectional area of the active layer 38 able to conduct current is physically limited to the cross-sectional area of the opening. This helps control leakage currents through the structure, and thus making the off-resistance of the electrical device more predictable. It also allows the layer 42 to effectively hermetically seal the portion of the active layer 38 within said opening.

Figure 4C:
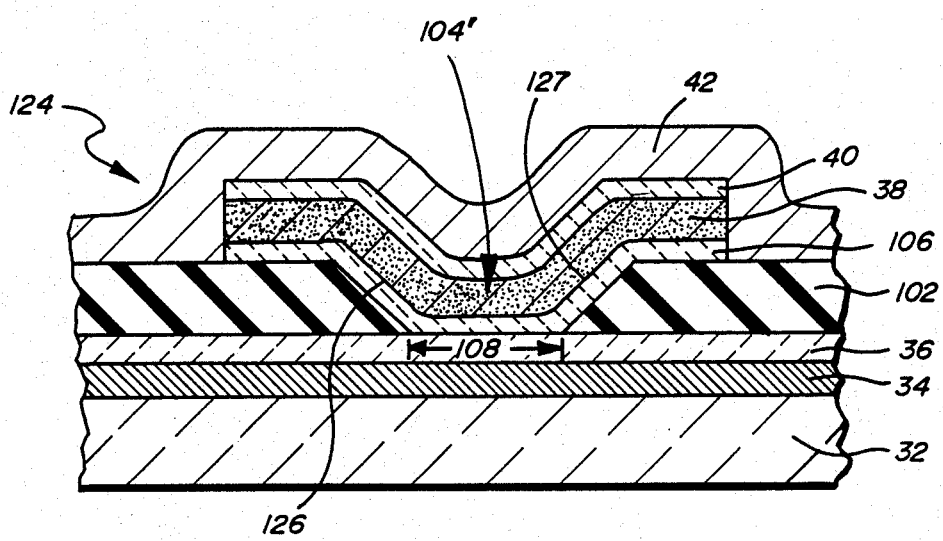

The electrical device 124 shown in FIG. 4C is constructed in a manner identical to the structure 118 shown in FIG. 4, except that the surface which may be composed of one or more surface portions of insulating layer 102 defining the opening 104' has a substantially sloping side wall, as can be seen as sloping surface portions 126 and 127. The sloping side wall may be produced, for example, by isotropically etching away the central portion of insulating layer 102 using any conventional or suitable wet etchant, which results in an arcuate etched surface familiar to those in the art. Alternately, dry etching processes involving energetic particle bombardment of the layer to be etched in the vertical direction, and chemical etching due to reactive gas species in all directions, can be used to form a sloping surface such as surface portions 126 and 127 shown in FIG. 4C. For example, reactive ion etching may be used to form the sloped side wall of opening 104' by adjusting the cathode-to-substrate bias voltage, pressure and gas flow rate to control the vertical-to-horizontal etch ratio, thereby obtaining the desired degree of sloping. The average degree of sloping as measured from the horizontal face of layer 38 and depending on the material being deposited, may be in the range from about 30° to about 70° and is preferably between about 35° and about 55°, e.g., 45°.

The structure 124 shown in FIG. 4C has at least one advantage over the structure described in FIGS. 4A and 4B, namely, it is substantially free of step coverage problems. On occasion, we have observed that in a circular opening several microns in diameter and having substantially vertical side walls in an insulating layer approximately 5,500 angstroms thick, such as layer 102, the semiconductor or active layer 38 is not always uniformly deposited therein. This is believed due to step coverage problems such as voids and overhangs. This nonuniformity may well produce variations in the thickness of the active layer 38 in the opening in the insulating layer 102 as severe or more severe than those shown in FIG. 4B. Such variations in thickness or other step coverage problems can result in uncontrolled variations in key electrical characteristics of the active layer, such as the threshold voltage value. Sloping these side walls substantially eliminates the step coverage problems, and should greatly assist in providing very uniform device characteristics. Furthermore, as explained below, structure 124 need not exhibit any more leakage current than expected from an opening having the same diameter 108 as structure 124, since the minimum effective cross-sectional area of the opening is determined by the diameter 108.

Carbon barrier layers 36, 106 and 40 can be omitted from the FIG. 4C structure, if desired, so that electrode layers 34 and 40 directly contact the active layer 38. When layer 106 is used, and it is desired to keep the effective cross-sectional area of the device 124 substantially equal to the area of the smallest part of the opening (i.e., at the bottom thereof), layer 106 should be kept as thin as practical, and layer 106 should be fabricated with a resistivity sufficiently high so that the lateral resistance of layer 106 such as along sloping surface portions 126 and 127 does not substantially add to any leakage current which flows through the device under normal operating conditions. This effectively eliminates the sloping portions of layer 106 as a source of additional leakage current. The pure amorphous carbon material disclosed above can be readily deposited with almost any desired resistivity by simply adjusting the sputtering power density. Other barrier layer materials known to those in the art which are substantially inert with respect to the active layer 38 and which have or (can be modified to have) suitable resistivity may be used in place of carbon material in layer 106.

The FIG. 4C structure is believed to be particularly suitable for memory cells having an opening or pore size less than 10 microns in diameter, especially a pore between about 1 micron and about 5 microns in diameter. The structure in FIGS. 4A through 4C show the use of three carbon layers 36, 106 and 40. If desired, layer 36 may be omitted, so that layer 106 makes direct contact with electrode layer 34. When layer 36 is omitted, it is preferably to increase the thickness of layer 106 somewhat to 200 to 500 angstroms or more.

Figures 5A, 5B:
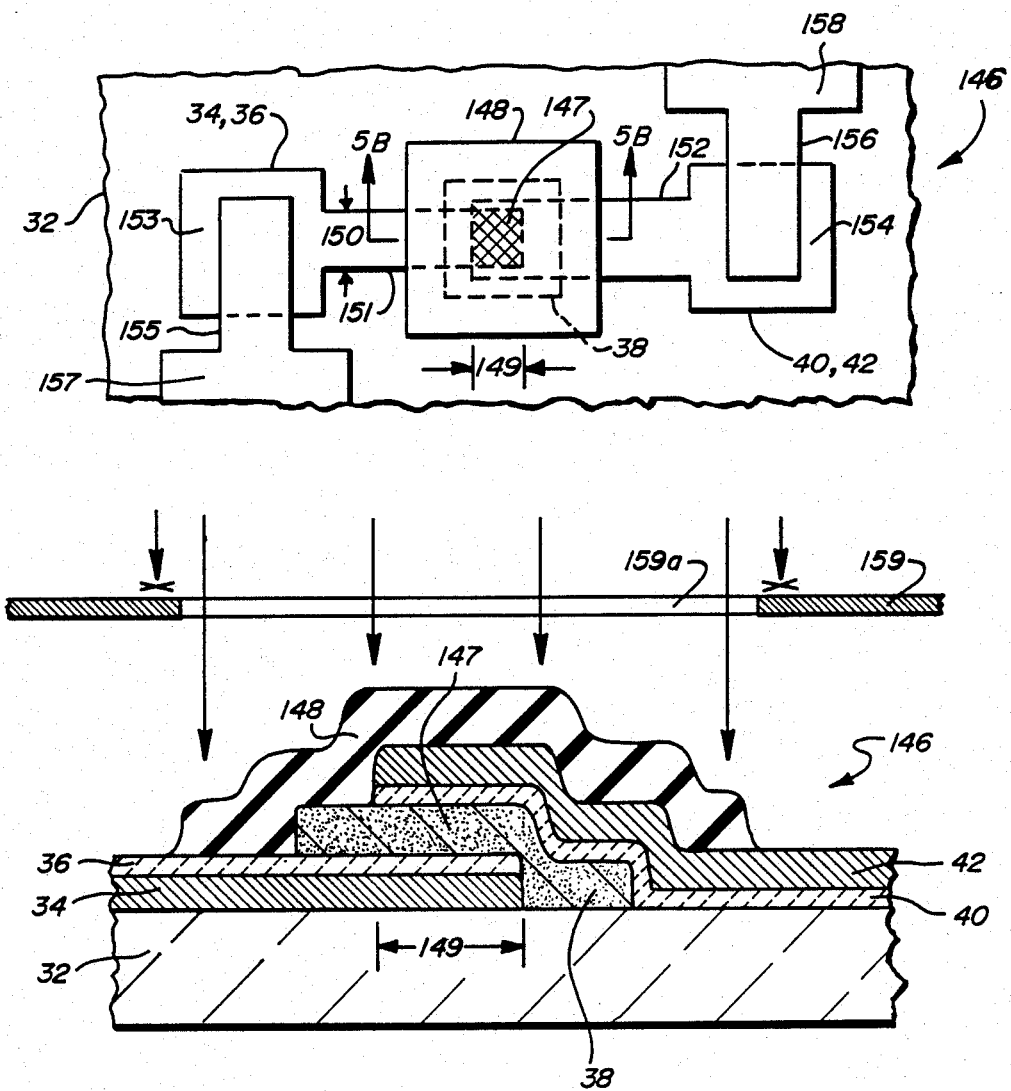
FIG. 5A is a partial plan view of another electrical device of the present invention which has a fully encapsulated active region and FIG. 5B is an enlarged cross-sectional side view taken along line 5B—5B in FIG. 5A.

Thin film structure 146 of FIGS. 5A and 5B is another electrical device of the present invention having a vertical conduction path 147, which is only in the cross-hatched region of FIG. 5A between the lower and upper electrodes. Device 146, which may be constructed on any substrate 32 having an insulating surface, includes a bottom electrode comprised of metallic electrode layer 34 and thin film carbon layer 36, active layer 38 of threshold switching material, and a top electrode comprised of thin film carbon layer 40 and metallic electrode layer 40, all preferably patterned and operatively arranged as shown. The central active portion of the device 146 is fully encapsulated or hermetically sealed by passivating layer 148 of insulating material relatively inert with respect to the various layers thereunder, particularly layer 38. The cross-sectional area of conduction path 147 is determined by the amount of longitudinal overlap 149 and transverse overlap 150 between finger portion 151 of the bottom electrode and finger portion 152 of the top electrode. In the illustrated embodiment, the transverse overlap 150 equals the width of smaller finger portion 151. The bottom and top electrodes also include larger contact portions 153 and 154 respectively positioned away from the central region of device 146, where electrical interconnections may be made to the device. Still larger contact electrodes 155 and 156 respectively having contact pad portions 157 and 158 (partially shown) may be provided if desired to permit soldering or other coarse bonding techniques to used to make electrical connections to the device. Our prototypes of device 146 were constructed on a single-crystal silicon wafer having a thermally grown silicon oxide surface layer in the manner indicated in Table II (thickness in angstroms):

TABLE II

| Reference Numeral | Exemplary Material | Range of Thicknesses | Typical Thickness |
| --- | --- | --- | --- |
| 155, 156 | aluminum | 1,500–2,500 | 2,000 |
| 148 | silicon monoxide | 1,500–2,000 | 1,500 |
| 42 | chromium | 1,500–2,500 | 1,500 |
| 40 | a-carbon | 500–1,000 | 1,000 |
| 38 | $As_{34}Te_{28}S_{21}Ge_{16}Se_1$ | 4,000–6,000 | 5,000 |
| 36 | a-carbon | 500–1,000 | 1,000 |
| 34 | chromium | 1,500–2,500 | 1,500 |

Several hundred devices were made simultaneously on the substrate, which then was diced to obtain individual devices inserted into D0-18 packages for testing. Our prototype devices 146 demonstrated excellent long-term D.C. stability, even when operating at temperatures between 100° C. to 150° C. We attribute the success of these prototypes of device 146 to the use of amorphous thin film carbon as barrier layers to help stabilize the morphology of active layer 38, and to the preferred fabrication and sealing of the central region of device 146 in a continuous partial vacuum.

In our preferred method for making device 146 prototypes, substrate 32 was cleaned with a conventional wet etch and then placed in a vacuum deposition chamber, which was then pumped down and maintained at the desired vacuum levels required for the various directional electron beam sputtering or thermal evaporation steps. Layers 34 through 42 and layer 148 were successively deposited as shown using for patterning four metal masks, each having an opening corresponding to the desired outline of the layer or layers deposited therethrough. Each mask was moved as needed into close proximity to the substrate and carefully aligned. In the continuously maintained partial vacuum, bottom electrode metallic layer 34 and carbon layer 36 were deposited through the first mask, active layer 38 was sputtered through the second mask, upper electrode carbon film layer 40 and metallic layer 42 were deposited through the third mask, and passivating layer 148 was sputterred through the fourth mask. In FIG. 5B, a portion 159 of the fourth mask, having an opening 159a is schematically shown in aligned position relative to the substrate 32. The vertical spacing between the four masks and substrate was within a suitable range of distances such as 20–50 microns. The six vertical arrows in FIG. 5B depict the relative direction of travel of material 148 perpendicular to substrate 32 as it is being deposited through the opening 159a in the fourth mask. The minimum size of the opening in our metal masks was on the order of 25 microns, which corresponds to dimension 149 shown in FIG. 5A. Since techniques for depositing materials by sputtering or evaporation through masks have long been well known in the art, further details of same need not be provided here. The foregoing method of making device 146 helps ensure that layer 38 therein is deposited and remains in a pristine state, since layer 38 received no appreciable exposure to air, water vapor, or etchants, processing gases, effluents or residues associated with conventional wet or dry photolithographic patterning techniques, which might otherwise help produce in layer 38 surface states, leakage paths (especially along side surfaces and edges), and other contamination-related problems.

Figure 6:
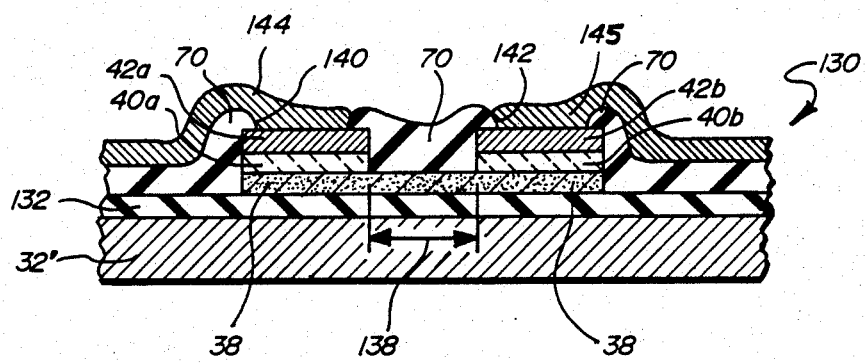
FIG. 6 is a side view in cross-section of a horizontally arranged electrical device of the present invention.

Structure 130 in FIG. 6 is a horizontal embodiment of an electrical device of the present invention. One advantage of the horizontal device over the vertical structures shown in the previous Figures is that it has fewer layers and accordingly fewer fabrication steps are required. However, the horizontal device requires more area than a typical vertical structure having one electrode located vertically above the other electrode. The substrate 32' is shown to be a conductive material, preferably a metal such as copper or a metal alloy which has high thermal conductance to help dissipate heat generated during the operation of device 130. The layer 132 is an electrical insulating material such as deposited diamond, siliconoxynitride, beryllium oxide, alumina, sputtered quartz or like, which has relatively good thermoconductance properties so that heat may be relatively efficiently transferred from semiconductor layer 38 to the substrate 32' which serves as a heat sink. The thickness of layer 132 is preferably 100 angstroms to 500 angstroms thick or more. The thickness required depends upon the dielectric qualities of the insulating material chosen for layer 132 as well as the potential difference experienced between the substrate 32' and the semiconductor layer 38 during operation.

The structure 130 includes a first and second electrode 42a and 42b and a first and second carbon film 40a and 40b associated with these two electrodes. In operation, the current flows into one of the electrodes, such as electrode 42a, through which associated carbon film 40a, then horizontally through semiconductor layer 38, and then vertically through the second carbon film 40b associated with a second electrode 42b. When made of amorphous chalcogenide semiconductor materials, layer 38 should be on the order of 0.5 microns to 2 microns or thicker in order to be able to support a high current density, filamentary or plasma-like conduction current therethrough.

The structure 130 may be fabricated as follows. After cleaning substrate 32', the insulator layer 132 is deposited, and annealed if desired to improve its dielectric qualities. Thereafter, in a continuously maintained partial vacuum, the semiconductor layer 38, the thin film carbon layer 40 and electrode layer 42 may be deposited in sequence. Thereafter, using suitable lithographic and etching techniques, the electrode layer 42, the thin film carbon layer 40 may be etched as shown. Then a suitable photoresist may be applied over an entire structure and patterned so that a central portion 138 of the semiconductor layer is not subject to etching, while the portions of the semiconductor layer 38 everywhere except under the electrodes 42a and 42b are etched away by a suitable etchant. After removing a photoresist layer used for such patterning, the layer 70 of insulating material is deposited and patterned so as to create vias 140 and 142 to allow a top metallization layer to make electrical contact with the electrodes 42a and 42b. Thereafter, the top metal layer may be patterned into conductors 144 and 145 as shown. If desired, the top metallization layer can be made reasonably thick such as 1.0 to 2.5 microns or more to help provide an additional route for heat to escape from the structure 130.

Figure 7:
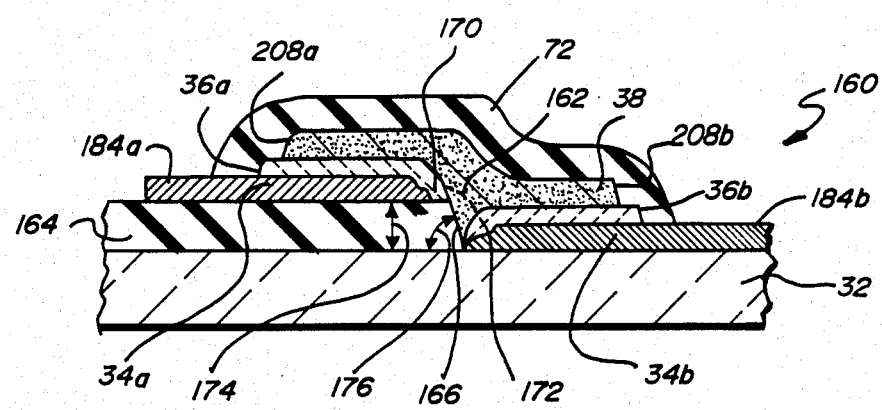
FIG. 7 is a side view of an electrical device of the present invention having a substantially diagonal current conduction path.

Thin film structure 160 shown in FIG. 7 is another embodiment of the present invention which is well suited for use as a threshold switching device. The structure 160 features a substantially diagonal current conduction path in the general direction suggested by dotted line 162 between the two electrodes as will shortly be further explained. The structure 160 includes a layer of patterned insulating layer 164 provided with a sloped or diagonal face 166 in the vicinity of the current conduction path. The first electrode 34a and its associated carbon film layer 36a are disposed on top of the patterned insulating layer 164. The second electrode 34b and its associated carbon film layer 36b are located on the substrate 32 adjacent to the face 166 of insulating layer 164. The electrodes 34a and 34b are spaced apart from each other. Their respective carbon film layers 36a and 36b are also spaced apart from one another as shown. The part 170 of carbon layer 36a and the part 172 of carbon layer 36b are the portions of those thin film carbon layers which are closest to one another, and are diagonally spaced apart from one another. The semiconductor layer 38 is deposited on top of the thin film carbon layers 36a and 36b and extends at least between the nearest portion 170 and 172 of the carbon layers 36a and 36b to provide a current conduction path therebetween. The length of the current conduction path largely dependent upon the height 174 of insulating 164 and the angle 176 between the face 166 of layer 164 and the substrate 32. Accordingly, the length of the current conduction path 132 may be readily controlled by adjusting the thickness 174 and angle 176 of the insulating layer 164. To avoid degradation of the semiconductor material 38, the structure 160 is preferably provided with a passivating layer 72 which encapsulates the patterned semiconductor layer 38 as shown. Connections to the semiconductor device of structure 160 may be made at in extending portions or paths 184a and 184b of electrodes 34a and 34b respectively.

Figure 8A:
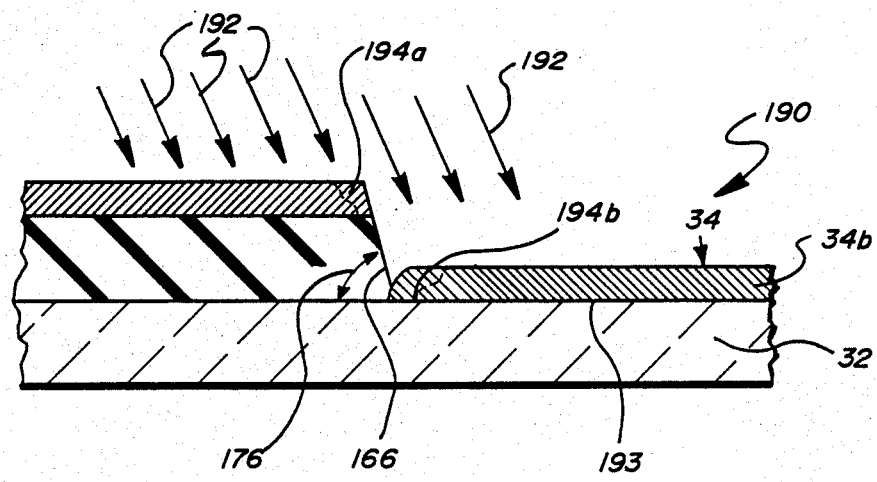
FIGS. 8A and 8B are side views of the FIG. 7 device when partially constructed illustrating its method of construction.
Figure 8B:
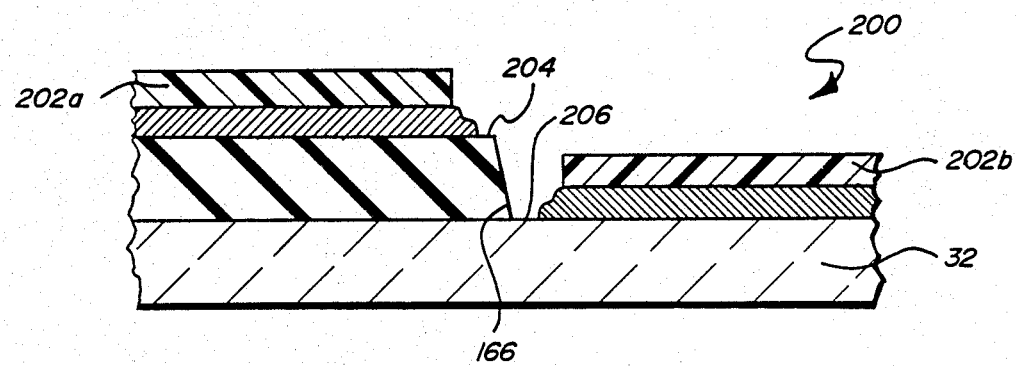

A preferred method for fabricating the structure 160 shown in FIG. 7 is disclosed in the partially completed structures of FIGS. 8A and 8B. To create the partially completed structure 190 of FIG. 8A a layer of insulating material 164 is deposited on substrate 32, and a layer of photoresist is deposited thereover and patterned into a mask required for the etching step which immediately follows. Layer 164 is then subjected to a suitable anisotropic dry etch which removes the right half of the layer, and in so doing leave angled face 166. The anisotropy of the dry etching step is controlled so as to produce a rather steep angle 176 on the order of 45 to 90 degrees. Then, the photoresist mask is removed. Next, the electrode layer 34 is directionally sputtered onto the substrate 32 and patterned insulating layer 164 as shown by arrows 192 so as to deposit electrode material on top of the insulating layer 164 and on a surface portion 193 of the substrate 32, without depositing much if any electrode material on the face 166.

Partially completed structure 200 in FIG. 8B depicts several processing steps after the deposition of electrode layer 34. First, a layer of photoresist material 202 is deposited and patterned into mask 202a and 202b as shown in electrode layer 34a and 34b. Thereafter, the electrode layers 34a and 34b are subjected to an isotropic wet etch to remove the corner portions 194a and 194b indicated in FIG. 7, thereby recessing the electrode layers 34a and 34b slightly away from the face 166, as indicated by spaces 204 and 206. The photoresist mask 202a and 202b are then removed. A carbon electrode layer 36a and 36b are then directionally sputtered in a partial vacuum onto the electrodes 34a and 34b at an angle such as that which was used to deposit the electrode layers 34 as depicted in FIG. 7. In this manner, substantially no carbon material is deposited upon face 66. Then, without breaking vacuum, the semiconductor layer 38 is deposited over the carbon electrode layers 36a and 36b. Layer 38 is then patterned to form side surfaces 208a and 208b. The thin film carbon layers 36a and 36b can also be patterned as shown. These two patterning steps expose the electrode portions 184a and 184b. The passivation layer 72 is thereafter deposited and patterned as shown so as to once again expose the extending portions 184a and 184b of electrodes 34a and 35b. If desired, carbon layer 36, semiconductor layer 38 and passivating layer 72 can each be patterned in said vacuum by depositing each of the layers through suitable metal masks provided with openings therein, in the manner described with respect to FIG. 4B.

Except for FIG. 5A, FIGS. 1 through 8 do not show any plan views of the structures of the present invention. However, those skilled in the art will readily appreciate that the structures shown therein can be formed in a variety of sizes and shapes. For example, the opening in the insulating layer of FIG. 4 may be made circular, square, rectangular, or any other desired shape. Similarly, the distance between electrodes in FIG. 5 may be adjusted.

Although the foregoing embodiments have been described with respect to threshold switching semiconductor materials, it is to be appreciated that memory semiconductor materials could also be used for layer 38. A memory semiconductor device serving as a single cell in a memory array is typically formed in an opening or pore in a layer of insulating material. Such memory arrays are disclosed, for example, in aforementioned copending U.S. patent application Ser. No. 899,442 and U.S. Pat. No. 4,599,705. The diameter of the pore may, for example, range in size from one micron to ten microns. The FIG. 4 structures each can be readily adapted to serve as such a memory device, as the following comments concerning FIG. 4B will illustrate.

A typical resettable memory semiconductor material which may be used as layer 38 in the FIG. 4B structure may be composed of three layers 38a through 38c as indicated in Table II below. Sublayers 38a through 38c are thin films vertically stacked one upon the other in contiguous fashion. The relative order of the sublayers 38a through 38c must be maintained but it does not matter whether 38a or layer 38c is the top sublayer. Typical thicknesses for the other layers in the integrated FIG. 4B structure, when it is used as a thin film memory cell in an integrated array of such memory cells, are also given in Table III.

TABLE III

| Reference Numeral | Preferred Material | Typ. Thickness (In angstroms) |
| --- | --- | --- |
| 110 | aluminum | 7,000 |
| 42 | molybdenum | 1,000 |
| 40 | a-carbon | 60 |
| 38c | Te | 3,000 |
| 38b | $Ge_{65}Te_{31}Sb_2S_2$ | 2,000 |
| 38a | $Ge_{24}Te_{72}Sb_2S_2$ | 2,000 |
| 106 | a-carbon | 100 |
| 102 | $SiO_xN_y$ | 5,500 |
| 36 | a-carbon | 100 |
| 34 | molybdenum | 1,500 |

The memory material listed in Table III is a phase change chalcogenide memory material that is deposited in a high resistance substantially amorphous condition typically by sputtering. Any of the memory semiconductor materials disclosed in the U.S. patents cited in Part B of the Background above may also be utilized in the electrical devices of the present invention to form memory devices or cells. The memory materials described therein include materials which are resettable many times, and those which are settable and substantially non-resettable such as the phase-change memory materials disclosed in aforementioned U.S. Pat. Nos. 4,499,557 and 4,599,705, such as these latter memory materials are typically deposited amorphous materials containing tetrahedral elements such as silicon, germanium, or carbon, are preferably formed as alloys and may include dopants and/or one or more density of states reducing elements, such as hydrogen and/or fluorine.

Memory devices made using the structures of the present invention are also expected to exhibit long-term D.C. stability due to the use of carbon barrier layers as part of their electrode structure. Those in the art will appreciate that any other semiconductor or active materials or other applications which would benefit from having highly inert thin film carbon electrodes may be used in the horizontal, vertical and diagonal thin film structures of the present invention. Also, the thin film devices of the present invention can be simultaneously made by the hundreds or thousands or more on a single large area substrate (e.g., 100 to 1000 cm²), using well known thin film fabrication and processing techniques, for economy of manufacture.

Having thus described several preferred embodiments of the present invention it is recognized that those skilled in the art may make various modifications or additions to the preferred embodiments chosen to illustrate the present invention without departing from the spirit and scope of the present contribution to the art. For example, the structures of the present invention may be utilized in all thin film electronic arrays or in hybrid crystalline/thin film electronic arrays, such as the memory arrays disclosed in some of the aforementioned patents. In such instances, thin film electrode layer 34 may be placed on top of or be replaced by a bottom electrode-forming layer which also forms part of a diode, other isolation device, or addressing means constructed on or in the thin film structure or crystalline structure below. The term "electrode" as used in the claims below is meant to include such electrode-forming layers. Therefore, it is to be understood that within the scope of the appended claims the invention can be practiced otherwise than has been specifically described above.

We claim:

1. An electrical device comprising:
    (a) a first thin film electrode having at least one current carrying portion and a first deposited thin film of electrically conductive, non-single crystal, phase stable, non-switching carbon material in intimate electrical contact with at least one portion of said first thin film electrodes;
    (b) a body of semiconductor material having at least one current carrying portion thereof in intimate electrical contact with said thin film of carbon material and arranged such that current flowing between the semiconductor material and the current carrying portion of the first thin film electrode passes through the thin film of carbon material;
    (c) a second thin film electrode spaced substantially horizontally apart from said first thin film electrode and having at least one current carrying portion and a second deposited thin film of electrically conductive, non-single crystal, phase stable, non-switching carbon material thereon in intimate electrical contact with at least one portion of said second thin film electrode and with said current-carrying portion of said body of semiconductor material, said second deposition thin film of carbon material being spaced substantially horizontally apart from said first deposited thin film of carbon material, and at least a portion of said thin film semiconductor material extending between said first and second deposited carbon thin films such that when a current conduction path is formed thereon the current conduction path extends substantially horizontally through the thin film semiconductor material between the thin films of semiconductor material.

2. An electrical device as in claim 1 wherein said film of carbon material and said current-carrying electrode portion are arranged such that said carbon material is a current-carrying portion of said device.

3. An electrical device as in claim 1 wherein said film of carbon material is substantially amorphous.

4. An electrical device as in claim 1 wherein the electrical resistivity of said film of carbon material is less than about $10^6$ ohm-centimeters.

5. An electrical device as in claim 4 wherein said resistivity is less than about $10^3$ ohm-centimeters.

6. An electrical device as in claim 4 wherein said resistivity is less than about one ohm-centimeter.

7. An electrical device as in claim 1 wherein said semiconductor material is a memory material.

8. An electrical device as in claim 7 wherein at least a portion of said memory material is switchable between a high resistance disordered condition and a low resistance more ordered condition by current applied through said film of carbon material.

9. An electrical device as in claim 1 wherein said semiconductor material is a threshold switching material.

10. An electrical device as in claim 9 wherein said threshold switching material has a threshold voltage value and a high electrical resistance to provide a blocking condition for substantially blocking current therethrough, wherein said high electrical resistance in response to a voltage above said threshold voltage value very rapidly decreases in at least one path to a low electrical resistance which is orders of magnitude lower than the high electrical resistance to provide a conducting condition for conducting current therethrough.

11. An electrical device as in claim 10 wherein said film of carbon material has a thickness of less than about 2000 angstroms.

12. An electrical device as in claim 11 wherein said refractory material is molybdenum.

13. An electrical device as in claim 10 wherein the thickness of said film of carbon material is less than about 200 angstroms.

14. An electrical device as in claim 10 wherein said current-carrying electrode portion in electrical contact with said film of carbon material consists essentially of refractory material, and said carbon material is substantially pure.

15. An electrical device as in claim 1 wherein said thin film materials are arranged in layers stacked one top of the other such that when a current conduction path is formed in said device between said first and second electrodes, said path extends substantially vertically through said thin film carbon material and said semiconductor material.

16. An electrical device as in claim 1 wherein said first and second films of carbon material are spaced substantially horizontally apart from one another, said first and second electrodes are spaced substantially horizontally apart from one another, and at least a portion of said semiconductor material extends generally between said first and second films such that when a current conduction path is formed it extends substantially horizontally through said semiconductor material between said films of carbon material.

17. An electrical device as in claim 1 wherein said semiconductor material, said films of carbon and said electrodes are arranged in layers one on top of another, forms in said device, it extends substantially diagonally through said semiconductor material between said parts of said films of carbon material.

18. An electrical device as in claim 1 wherein at least one electrode, one film of carbon material, and the layer of said semiconductor material have been patterned to form a mesa structure.

19. An electrical device as in claim 1 further comprising:
    a layer of insulating material having an opening therein in which at least a portion of said semiconductor material extends, and wherein
    said first film of carbon material and said first current-carrying electrode portion are disposed below said opening, and
    said second film of carbon material and said second current-carrying electrode portion are disposed above said portion of said semiconductor material in said opening, such that said current conduction path is formed in said device, it extends substantially vertically between said electrode portions through said portion of said semiconductor material disposed in said opening.

20. An electrical device as in claim 19 wherein said opening has at least one dimension substantially perpendicular to said current conduction path which is less than about five microns.

21. An electrical device as in claim 1 wherein said film of carbon material is substantially pure carbon.

22. An electrical device comprising:
(a) a first thin film electrode having at least one current carrying portion and a first deposited thin film of electrically conductive, non-single crystal, phase stable, non-switching carbon material in intimate electrical contact with at least one portion of said first thin film electrode;
(b) a body of semiconductor material having at least one current carrying portion thereof in intimate electrical contact with said thin film of carbon material and arranged such that current flowing between the semiconductor material and the current carrying portion of the first thin film electrode passes through the thin film of carbon material
(c) a second thin film electrode spaced from said first thin film electrode and having at least one current carrying portion and a second deposited thin film of electrically conductive, non-single crystal, phase stable, non-switching carbon material in intimate electrical contact with at least one portion of said second thin film electrode and with said current-carrying portion of said body of semiconductor material;
(d) a layer of insulating material having an opening therein with a dimension less then about 5 microns in which a portion of said semiconductor material extends, said first carbon thin film and said first electrode being disposed below said layer of insulating material, and said second carbon thin film and said second electrode being disposed above said layer of insulating material such that a current conduction path extends through the semiconductor material disposed in the opening.

* * * * *